United States Patent
Yaung et al.

(10) Patent No.: US 6,806,521 B2
(45) Date of Patent: Oct. 19, 2004

(54) INTEGRATED HIGH PERFORMANCE MOS TUNNELING LED IN ULSI TECHNOLOGY

(75) Inventors: Dun-Nian Yaung, Taipei (TW); Kuo-Ching Huang, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 10/338,138

(22) Filed: Jan. 8, 2003

(65) Prior Publication Data

US 2004/0132264 A1 Jul. 8, 2004

(51) Int. Cl.$^7$ .................. H01L 31/062; H01L 21/336
(52) U.S. Cl. .................. 257/290; 257/292; 438/142; 438/197
(58) Field of Search .................. 257/288, 290, 257/291, 292, 293, 294, 369; 438/142, 197, 203

(56) References Cited

U.S. PATENT DOCUMENTS

| | | | |
|---|---|---|---|
| 5,918,119 A | * 6/1999 | Huang | 438/238 |
| 5,994,204 A | 11/1999 | Young et al. | 438/455 |
| 6,160,282 A | * 12/2000 | Merrill | 257/292 |
| 6,171,911 B1 | * 1/2001 | Yu | 438/275 |
| 6,242,324 B1 | 6/2001 | Kub et al. | 438/455 |
| 6,335,262 B1 | 1/2002 | Crowder et al. | 438/440 |
| 6,346,445 B1 | 2/2002 | Hsu | 438/279 |
| 6,538,267 B2 | * 3/2003 | Bordogna et al. | 257/184 |
| 6,611,013 B2 | * 8/2003 | Rhodes | 257/292 |
| 2002/0172071 A1 | * 11/2002 | Feurle et al. | 365/149 |

* cited by examiner

Primary Examiner—T. N. Quach

(57) ABSTRACT

A new method and structure for the combined creation of CMOS devices and LED devices. The process starts with a substrate over the surface of which are designated a first surface region for the creation of CMOS devices there-over and a second surface region for the creation of LED devices there-over. A relatively thick layer of gate oxide is created over the surface of the substrate. The first surface region is blocked by a mask of photoresist after which the second surface region is exposed to a plasma etch, thereby providing roughness to the surface of the relatively thick layer of gate oxide and reducing the thickness thereof. The blocking mask is removed, additional oxidation of the exposed surface creates a relatively thick layer of gate oxide over the first surface area and a relatively thin layer of gate oxide over the second surface area.

38 Claims, 3 Drawing Sheets

US 6,806,521 B2

INTEGRATED HIGH PERFORMANCE MOS TUNNELING LED IN ULSI TECHNOLOGY

BACKGROUND OF THE INVENTION (1) Field of the Invention

The invention relates to the fabrication of integrated circuit devices, and more particularly, to a method and structure for the creation of A Metal Oxide Semiconductor tunneling Light Emitter Diode and CMOS devices over the surface of one semiconductor substrate.

(2) Description of the Prior Art

In the creation of semiconductor devices, it is frequently advantageous to create functionally different devices over the surface of one substrate, whereby in addition the process of creating the devices of different functionality is partially or in totality combined. In order to achieve this latter objective, the processes of creating functionally different devices over the surface of one substrate must be compatible processes and must further be extended to comprise interconnecting the created devices in order to create one unit comprising diverse and functionally cooperative devices. As one of the significant advantages that can be achieved using this approach is the always present and importance consideration of cost effectiveness.

Complementary Metal Oxide Semiconductor (CMOS) devices take up a significant portion of presently used semiconductor devices. By combining the CMOS device with a MOS tunneling Light Emitter Diode (LED) diode capability, it is now possible to create over the surface of one semiconductor device a device that can be applied for the creation of small-scale or micro images. This combined capability requires the creation of junctions that interface between surface regions created over the surface of a substrate of different conductivity, such as a junction between a region of n-type conductivity and an underlying well of p-type conductivity (referred to as an $N\#^+/PW$ junction) or a junction between an n-well that is created over the surface of a substrate having p-type conductivity (referred to as an NW/Psub junction). These junctions have in the art been widely used as detectors that form a functional part of a Light Detecting Diode. Recent advantages in realizing low-voltage operation of CMOS devices have led to the development of MOS LED devices. It has thereby been observed that as advantageous factors in the design of such MOS LED devices can be applied decreasing the thickness of a layer of gate oxide of the gate electrode, as this layer becomes part of the LED (Light Emitter Diode) function, and of increasing the roughness of the oxide layer that is used for the creation of a MOS LED, which can lead to enhanced light emission of the MOS LED. The latter aspect of increasing surface roughness has been proposed to be achieved by creating the layer of gate oxide using methods of low-temperature oxidation, which result in increasing oxide layer surface roughness. This however also results in reducing the quality of the layer of gate oxide underneath the gate electrode, which has a severely negative impact on gate electrode performance and which is therefore unacceptable as a design approach. It is therefore of advantage to use a dual gate oxide process, combined with the application of a gate oxide dry etch, which combined methods allow for the creation of MOS LED devices. The invention provides such a method.

U.S. Pat. No. 6,1242,324 B1 (Kub et al.) shows a process for LED devices over CMOS devices.

U.S. Pat. No. 6,346,445 B1 (Hsu) shows a dual gate oxide process.

U.S. Pat. No. 6,335,262 B1 (Crowder et al.) shows another dual gate oxide process.

U.S. Pat. No. 5,1994,204 (Young et al.) shows a LED process with light shields.

SUMMARY OF THE INVENTION

A principle objective of the invention is to simultaneously create CMOS devices and MOS tunneling Light Emitting Diodes over the surface of one semiconductor substrate.

Another objective of the invention is to provide a method for creating ultra-thin layer of gate oxide while as part of the same processing stream creating a layer of oxide of desired surface roughness.

In accordance with the objectives of the invention a new method is provided for the combined creation of CMOS devices and MOS tunneling LED devices. The process starts with a semiconductor substrate over the surface of which are designated a first surface region for the creation of CMOS devices there over and a second surface region for the creation of MOS tunneling LED devices there over. A relatively thick layer of gate oxide is created over the surface of the substrate. The first surface region is blocked by a mask of photoresist after which the second surface region is exposed to a plasma etch, thereby providing roughness to the surface of the relatively thin layer of gate oxide. The blocking mask is removed, additional oxidation of the exposed surface creates a relatively thick layer of gate oxide over the first surface area and a relatively thin layer of gate oxide over the second surface area.

BRIEF DESCRIPTION OF THE DRAWINGS

FIG. 6a shows a top view of a created MOS tunneling LED while

DESCRIPTION OF THE PREFERRED EMBODIMENTS

The creation of CMOS devices over the surface of a semiconductor substrate is well known in the art and, since this creation of CMOS devices is not the essential concern of the invention, no details that relate to this process of creating CMOS devices is required for an explanation of the invention and will therefore not be provided at this time.

The description of the invention will be limited to identifying surface areas of a substrate that are dedicated to the creation of either CMOS devices or MOS tunneling LED devices, the creation of the thereby applied layers of oxide will be detailed and is central to the invention.

The objectives of the invention can be summarized as follows and are presented at this time in order to more fully understand the following explanation of the invention:

CMOS devices are created over the surface of a substrate having a layer of gate oxide of a first thickness, and MOS tunneling LED are created concurrent with the creation of the CMOS devices, the MOS tunneling LED comprising a layer of oxide having a surface roughness and having a second thickness, whereby the second thickness is less than the first thickness by an amount.

Figure 1:
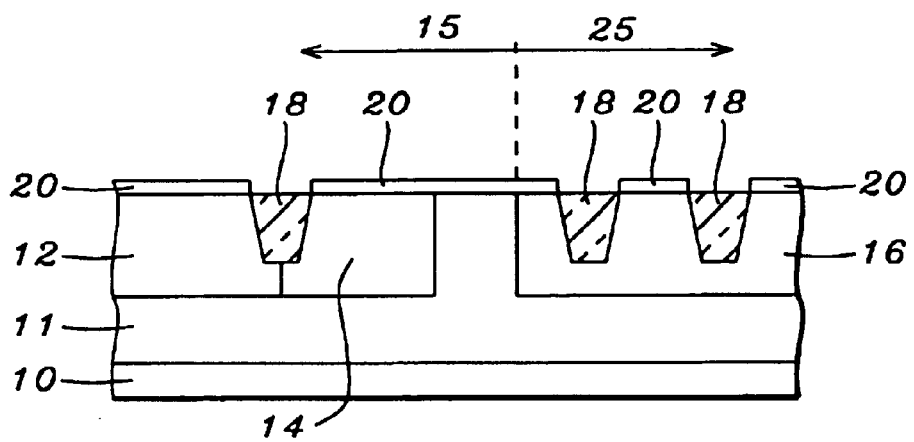
FIG. 1 shows the cross section of a semiconductor substrate over the surface of which has been designated a first surface region for the creation of CMOS devices and a second surface region for the creation of MOS tunneling LED devices. A relatively thick layer of gate oxide has been created over the surface of the substrate.
Figure 2:
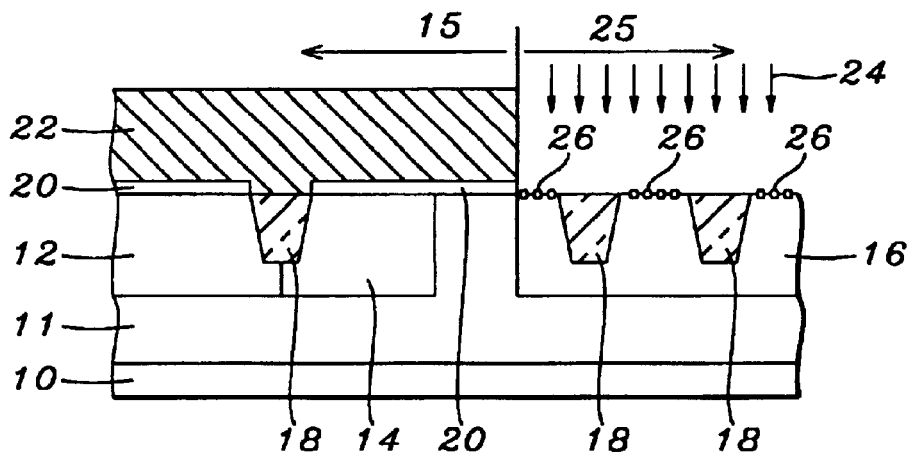
FIG. 2 shows the cross section after the first surface region of the substrate is blocked by a mask of photoresist, the second surface region is being exposed to a plasma etch.
Figure 3:
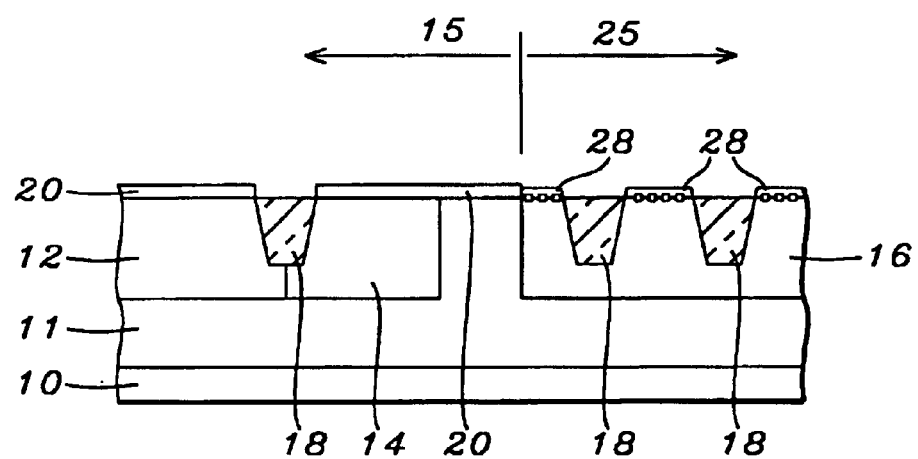
FIG. 3 shows the cross section after the blocking mask has been removed and after additional oxidation of the exposed surfaces has created a relatively thick layer of gate oxide over the first surface area and a relatively thin layer of gate oxide over the second surface area.

Reference is now made to FIGS. 1 through 3 for purposes of explaining the invention. Referring first specifically to FIG. 1, there is shown a cross section of the surface of a substrate 10. Surface region 15 has been designated as a surface region of substrate 10 over which CMOS devices are to be created while surface region 25 has been designated as a surface region of substrate 10 over which MOS tunneling LED are to be created. A region 11 of p-type conductivity has been provided in the surface of substrate 10.

Further highlighted over the surface of substrate 10 are regions 18 of Shallow Trench Isolation (STI) that serve the conventional purpose of electrically isolation adjacent devices created over the surface of substrate 10, such as PMOS/NMOS devices and MOS tunneling LED. More specifically, region 12 in the surface of substrate 10 has been doped to form an n-well for the creation of PMOS devices over the surface thereof while region 14 has been doped to form a p-well for the creation of NMOS devices over the surface thereof.

To provide the desired conductivity of the region 16, this region can be provided with n-well impurities. It is understood that the type of impurity of the various designated regions in the surface of substrate 10 can be arbitrarily selected, whereby however care must be taken that adjacent impurity implantations have the desired and correct impurity and opposite implantation with respect to each other.

As examples of the creation of n-well and p-well regions by performing impurity implantations, the following impurities, such as boron, phosphorous (P) or arsenic (As), and operating conditions can be cited:

| P-well implant: | boron | energy: | 100 to 220 keV |
| --- | --- | --- | --- |
| | | dose: | 1e13 to 1e14 atoms/cm$^2$ |
| | boron | energy: | 5 to 40 keV |
| | | dose: | 1e12 to 5e13 atoms/cm$^2$ |
| | indium | energy: | 50 to 250 keV |
| | | dose: | 1e12 to 1e14 atoms/cm$^2$ |
| N-well implant: | P | energy: | 300 to 600 keV |
| | | dose: | 1e13 to 5e14 atoms/cm$^2$ |
| | P | energy: | 50 to 300 keV |
| | | dose: | 1e12 to 5e13 atoms/cm$^2$ |
| | As | energy: | 50 to 200 keV |
| | | dose: | 1e12 to 1e14 atoms/cm$^2$ |

After the desired impurity implantations for regions 11, 12, 14 and 16 have been performed, the first layer 20 of gate oxide, having a first thickness, is created over the surface of substrate 10.

A layer of gate oxide is conventionally formed as a silicon dioxide material but may be a composite oxide, such as TEOS and silicon dioxide, or a nitride oxide layer or a like gate dielectric. The gate oxide can be silicon dioxide, thermally grown in an oxygen-steam ambient at a temperature between 800 and 1,000 degrees C. to a thickness of about 20 to 200 Angstroms. Alternatively, other methods of oxidation can be used for the creation of layer 20 of gate oxide, such as oxidation in a dry oxygen and anhydrous hydrogen chloride in an atmospheric or low pressure environment, or in a low temperature, high pressure environment and the like.

After the structure shown in cross section in FIG. 1 has been created, a mask 22, shown in cross section in FIG. 2, comprising photoresist is created over the surface of substrate 10 whereby the mask shields the surface region 15 of substrate 10 over which CMOS devices are to be created. The mask 22 exposes surface region 25 over the surface of which LED devices are to be created. Conventional methods of photoresist coating followed by photoresist exposure and removal are applied for the creation of photoresist mask 22.

The purpose of mask 22 is to protect the first layer 20 of gate oxide where this layer overlies surface region 15 over the surface of substrate 10, that is the layer of first gate oxide 20 that is used for the creation of CMOS devices over the surface thereof. This leaves the gate dielectric of gate oxide as it has initially been created and as shown in the cross section of FIG. 1.

By now applying a plasma etch 24, FIG. 2, to the surface of first layer 20 of gate oxide where this layer is exposed and overlying the surface region 25 of the substrate 10, a desired surface roughness 26 is provided in the surface of the exposed layer 20 of gate oxide.

The plasma etch 24 of a layer of silicon oxide, such as the exposed surface of layer 20, FIG. 2, can be performed by RIE or anisotropic plasma etching using an etchant containing fluorocarbons, for example $CF_4$ or $CHF_3$.

Plasma etch 24 typically uses a LAM processing tool, applying $CHF_3$ at a flow rate between about 70 and 130 scam, in a carrier gas of Ar at a flow rate sufficient to maintain a pressure between about 50 and 150 mTorr and at an rf power between about 300 and 600 Watt TCP and between about 300 and 500 Watts bias.

The surface roughness varies between about 3 and 10 Angstroms with a preferred value of about 5 Angstroms.

After the surface roughness 26 that is highlighted in the cross section of FIG. 2 has been established, the layer 22 of photoresist mask is removed from the surface applying conventional methods of photoresist ashing followed by a thorough surface clean, the results of which are shown in the cross section of FIG. 3. The removal of the photoresist mask 22 is then followed by creating a second layer 28 of gate oxide over the surface of the roughened layer 26 of gate oxide shown in cross section in FIG. 2. The creation of the second layer 28 of gate oxide simultaneously increases the first thickness of layer 20, since layer 28 is created without providing any mask over the surface of the layer 20 of first thickness.

The second layer 28 of gate oxide can be created by applying the same or similar processing conditions as have previously been highlighted for the creation of the first layer 20 of gate oxide. By selecting the processing conditions of the process for the creation of the second layer 28 of gate oxide, the thickness of this layer can be controlled and adjusted to a desired thickness. Care is required so that the thickness of the second layer 28 of gate oxide remains smaller that the thickness of the first layer 20 of gate oxide by an amount.

Layers 20, and 28, shown in the cross section of FIG. 3, are created to a preferred thickness of:

For layer 20, a preferred thickness is between about 40 and 250 Angstroms, and

For layer 28, a preferred thickness is between about 10 and 50 Angstroms.

This latter statement implies that the original thickness to which the layer 20, as shown in cross section in FIG. 1, is created is between about 40 and 250 Angstroms. The plasma etch 24 of FIG. 2, significantly reduces the thickness of the layer 20 overlying surface region 25 of the substrate. The creation of a second layer of gate oxide 28, as shown in cross section of FIG. 3, therefore allows this second layer 28 of gate oxide to be created to a thickness of between about 10 and 50 Angstroms.

The preferred thickness of the first layer 20 of gate oxide is about 70 Angstroms, the preferred thickness of the second layer 28 of gate oxide is about 30 Angstroms.

The process of creating CMOS devices and of creating therewith functionally cooperative LED devices can now continue. Examples of the creation of LED devices have been indicated in the cross sections of FIGS. 4 and 5.

Figure 4:
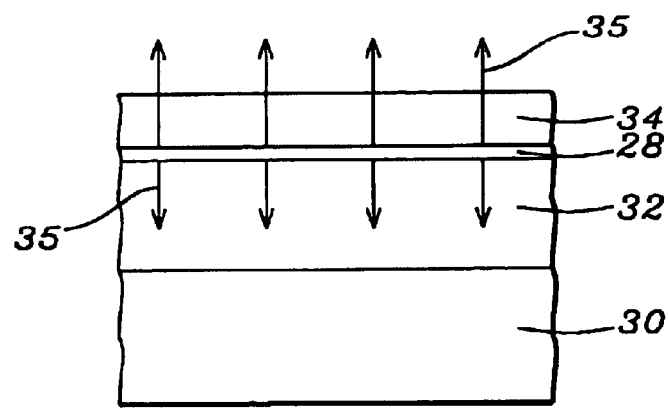
FIGS. 4 and 5 show cross sections of examples of MOS tunneling Light Emitting Diodes (LED).

Specifically highlighted in the cross section of FIG. 4, which represents a PMOS LED created over a p-type surface of a substrate, are:

30, a p-type layer of conductivity created in the surface of the substrate 32, an n-well created in the surface of the substrate, overlying the p-type layer 30

28, the second layer of gate oxide created in accordance with the cross sections of FIGS. 1 through 3

34, a patterned layer of polysilicon, which is doped to a desired level of conductivity, and 35, the energy or light emitted by the PMOS tunneling LED shown in cross section in FIG. 4.

Figure 5:
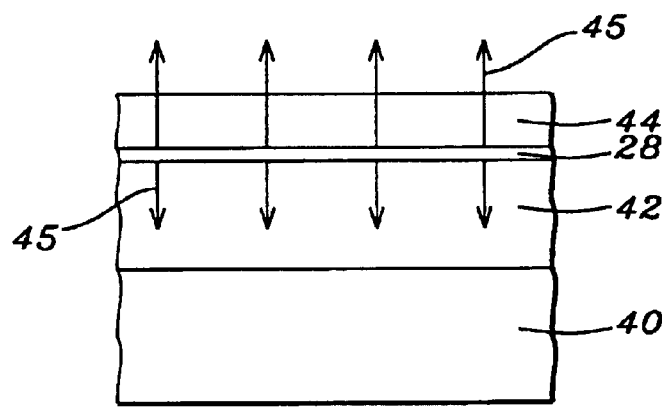

Specifically highlighted in the cross section of FIG. 5, which represents a NMOS LED created over a n-type surface of a substrate, are:

40, a n-type layer of conductivity created in the surface of the substrate 42, a p-well created in the surface of the substrate, overlying the n-type layer 40

28, the second layer of gate oxide created in accordance with the cross sections of FIGS. 1 through 3

44, a patterned layer of polysilicon, which is doped to a desired level of conductivity, and 45, the energy or light emitted by the NMOS LED shown in cross section in FIG. 5.

Figure 6A:
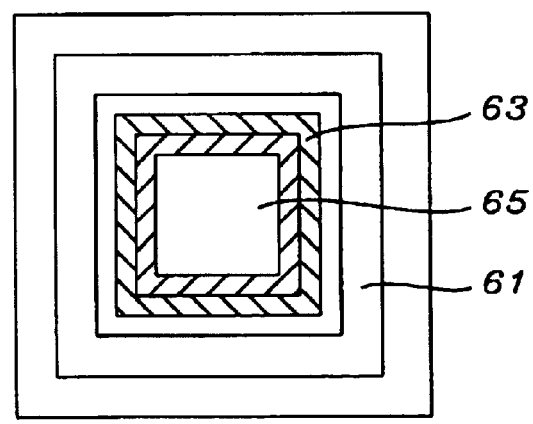
Figure 6B:
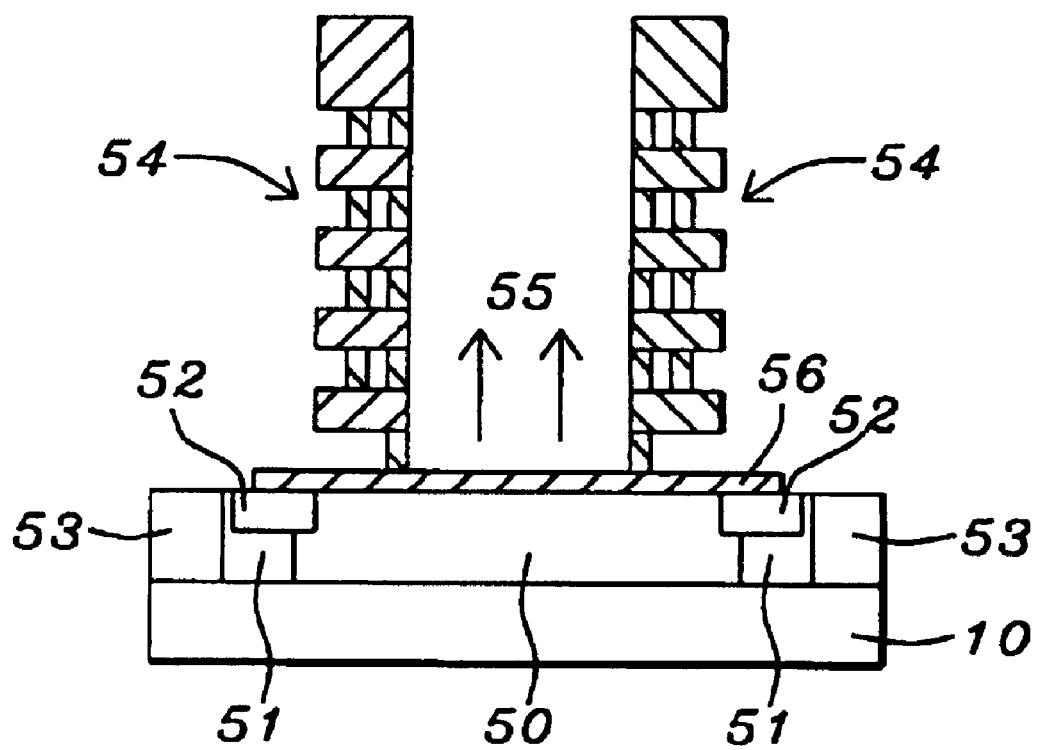
FIG. 6b shows a cross section of a created LED, thereby highlighting a light shield provided over the surface of substrate for the created MOS tunneling LED.

A practical application of the LED of the invention is shown in cross section and top view of FIGS. 6a and 6b.

FIG. 6a shows a top view of a PMOS tunneling LED device wherein specifically are highlighted the n-well 65 underlying the PMOS tunneling LED and the p-well 61 surrounding the PMOS tunneling LED. Element 63 is a top view of a light shield that is created surrounding the tunneling LED.

More specifically are shown in the cross section of FIG. 6b:

50, an n-type well created in the surface of a substrate, equivalent to element 65 of FIG. 6a 51, regions of p-type impurity implantations, equivalent to region 61 of FIG. 6a 52, regions of STI 53, regions of n-type impurity implantations 56, the gate oxide/polysilicon structure of the MOS tunneling LED, similar to elements 28/34 of FIG. 4 and 28/44 of FIG. 5

54, a light shield provided over the surface of substrate 10; this light shield can be created using non-light transmitting materials interspersed with layers of for instance insulation 55, the light emitted by the LED.

By providing the light shield, the MOS tunneling LED avoids light scattering of the emitted light 55.

To review the invention, basic aspects of design relating to the invention are:

the integration of the creation of light emitters and detectors into a CMOS compatible process enables optical interconnection between these devices and makes the micro-imager feasible for ULSI devices the MOS tunneling LED can be developed due to a low voltage operation environment, and by reducing the thickness of the layer of gate-oxide that is used for the MOS tunneling LED device and by increasing the surface roughness of this layer of gate oxide, light emission of the MOS tunneling LED are enhanced.

The methodology of the invention comprises:

a dual gate oxide process is combined with a gate-oxide plasma etch, creating an ultra-thin layer of gate oxide and a rough surface interface between the gate oxide of the LED device and the underlying silicon substrate the well/substrate diode of the invention has been provided with a guard structure, and a light shield is provided around the MOS LED of the invention.

The advantages that are provided by the invention are:

the integration of high-performance MOS tunneling LED technology with CMOS technology the increase in the roughness of the interface between the MOS tunneling LED without degrading the quality of the gate oxide of peripheral circuits, and the LED tunneling of the invention avoids light scattering.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of integrating Metal Oxide Semiconductor (MOS) tunneling Light Emitting Diode (LED) devices into Ultra Large Scale Integrated device technology, comprising the steps of:

providing a substrate, a first surface area of said substrate having been designated as being a surface area over which CMOS devices are to be created, a second surface area of said substrate having been designated as being a surface area over which LED devices are to be created;

creating a first layer of gate oxide having a first thickness over said first surface area of said substrate; and creating a second layer of gate oxide having a second thickness over said second surface area of said substrate, said second thickness being less than said first thickness, said creating a first layer of gate oxide and creating a second layer of gate oxide comprising:

(i) performing a first process of oxidation of said substrate;

(ii) performing a plasma etch to the gate oxide overlying the second surface area of the substrate; and (iii) performing a second process of oxidation of said substrate.

2. The method of claim 1, additionally creating CMOS devices over the first surface area of said substrate.

3. The method of claim 1, additionally creating MOS tunneling LED devices over the second surface area of said substrate.

4. The method of claim 3, said additionally creating MOS tunneling LED devices over the second surface area of said substrate comprising steps of creating at least one patterned layer of polysilicon over said second layer of gate oxide overlying said surface of gate oxide.

5. The method of claim 4, additionally creating at least one light shield aligned with and surrounding said at least one patterned layer of polysilicon.

6. The method of claim 5, said creating at least one light shield comprising steps of creating patterned overlying layers of semiconductor material, said patterned overlying layers of semiconductor material laterally extending from said at least one patterned layer of polysilicon.

7. The method of claim 6, wherein said patterned overlying layers of semiconductor material are dielectric materials or conductive materials.

8. The method of claim 3, said additionally creating MOS tunneling LED devices over the second surface area of said substrate comprising creating a PMOS tunneling LED over said substrate, said creating a PMOS tunneling LED over said substrate comprising steps of:

creating at least one region of p-type impurity in said substrate;

creating at least one region of n-type impurity overlying said at least one region of p-type impurity created in said substrate;

creating a second layer of gate oxide having a second thickness over said second surface area of said substrate; and creating at least one patterned layer of polysilicon over said second layer of gate oxide overlying said surface of gate oxide.

9. The method of claim 3, said additionally creating MOS tunneling LED devices over the second surface area of said substrate comprising creating a NMOS tunneling LED over said substrate, said creating a NMOS tunneling LED over said substrate comprising steps of:

creating at least one region of n-type impurity in said substrate;

creating at least one region of p-type impurity overlying said at least one region of n-type impurity created in said substrate;

creating a second layer of gate oxide having a second thickness over said second surface area of said substrate; and creating at least one patterned layer of polysilicon over said second layer of gate oxide overlying said surface of gate oxide.

10. The method of claim 1, said first thickness being between about 40 and 250 Angstroms.

11. The method of claim 1, said second thickness being between about 10 and 50 Angstroms.

12. A method of creating Metal Oxide Semiconductor (MOS) devices and of creating Light Emitting Diode (LED) devices over a substrate, comprising the steps of:

providing a substrate, a first surface area of said substrate having been designated as being a surface area over which CMOS devices are to be created, a second surface area of said substrate having been designated as being a surface area over which MOS tunneling LED devices are to be created;

performing a first process of oxidation of said substrate, thereby creating a first layer of gate oxide having a first thickness overlying said first surface area of said substrate, further creating a second layer of gate oxide having a second thickness overlying said second surface region of said substrate;

providing an etch resist mask over said first layer of gate oxide, shielding said first layer of gate oxide, exposing said second layer of gate oxide;

performing a plasma etch to the exposed surface of said second layer of gate oxide, creating a third layer of gate oxide having a third thickness overlying said second surface region of said substrate;

removing said etch resist mask from said first layer of gate oxide, exposing said first layer of gate oxide;

performing a second process of oxidation of said first layer of gate oxide and of said third layer of gate oxide, creating a fourth layer of gate oxide having a fourth thickness over said substrate overlying said first surface area of said substrate, further creating a fifth layer of gate oxide having a fifth thickness over said substrate overlying said second surface area of said substrate.

13. The method of claim 12, said first thickness being equal to said second thickness.

14. The method of claim 12, said third thickness being less than said second thickness by a first amount.

15. The method of claim 12, said fourth thickness being more than said first thickness by a second amount.

16. The method of claim 12, said fifth thickness being more than said third thickness by a second amount.

17. The method of claim 12, additionally creating CMOS devices over the first surface area of said substrate.

18. The method of claim 12, additionally creating LED devices over the second surface area of said substrate.

19. The method of claim 18, said additionally creating MOS tunneling LED devices over the second surface area of said substrate comprising steps of creating at least one patterned layer of polysilicon over said fifth layer of gate oxide.

20. The method of claim 19, additionally creating at least one light shield aligned with and surrounding said at least one patterned layer of polysilicon.

21. The method of claim 20, said creating at least one light shield comprising steps over creating patterned overlying layers of semiconductor material, said patterned overlying layers of semiconductor material laterally extending from said at least one patterned layer of polysilicon by a distance.

22. The method of claim 21, wherein said patterned overlying layers of semiconductor material are dielectric materials or conductive materials.

23. The method of claim 20, said additionally creating MOS tunneling LED devices over the second surface area of said substrate comprising creating a PMOS tunneling LED over said substrate, said creating a PMOS tunneling LED over said substrate comprising steps of:

creating at least one region of p-type impurity in said substrate;

creating at least one region of n-type impurity overlying said at least one region of p-type impurity created in said substrate;

creating a second layer of gate oxide having a second thickness over said second surface area of said substrate; and creating at least one patterned layer of polysilicon over said second layer of gate oxide overlying said surface of gate oxide.

24. The method of claim 20, said additionally creating MOS tunneling LED over the second surface area of said substrate comprising creating a NMOS tunneling LED over said substrate, said creating a NMOS tunneling LED over said substrate comprising steps of:

creating at least one region of n-type impurity in said substrate;

creating at least one region of p-type impurity overlying said at least one region of n-type impurity created in said substrate;

creating a second layer of gate oxide having a second thickness over said second surface area of said substrate; and creating at least one patterned layer of polysilicon over said second layer of gate oxide overlying said surface of gate oxide.

25. The method of claim 12, said first thickness being between about 40 and 250 Angstroms.

26. The method of claim 12, said fifth thickness being between about 10 and 50 Angstroms.

27. The method of claim 12, said plasma etching comprising performing an RIE or anisotropic plasma etch using an etchant containing fluorocarbons.

28. A structure of Metal Oxide Semiconductor (MOS) tunneling Light Emitting Diode (LED) devices integrated into Ultra Large Scale Integrated devices, comprising:

a substrate, the substrate comprising a first surface area over which CMOS devices are to be created, the substrate further comprising a second surface over which LED devices are to be created;

layers of gate oxide, comprising:

(1) overlying said second surface area a second layer of gate oxide having a second thickness, comprising:

(i) a plasma exposed lower layer of gate oxide; and (ii) an upper layer of gate oxide over the plasma exposed lower layer of gate oxide; and (2) overlying said first surface area a first layer of gate oxide having a first thickness, said first thickness being larger than said second thickness.

29. The structure of claim 28, additionally comprising CMOS devices over the first surface area of said substrate.

30. The structure of claim 28, additionally comprising MOS tunneling LED devices over the second surface area of said substrate.

31. The structure of claim 30, said additional MOS tunneling LED devices comprising at least one patterned layer of polysilicon over said second layer of gate oxide overlying said surface of gate oxide.

32. The structure of claim 31, additionally comprising at least one light shield aligned with and surrounding said at least one patterned layer of polysilicon.

33. The structure of claim 32, said at least one light shield comprising patterned overlying layers of semiconductor material, said patterned overlying layers of semiconductor material laterally extending from said at least one patterned layer of polysilicon by a distance.

34. The structure of claim 33, wherein said patterned overlying layers of semiconductor material are dielectric materials or conductive materials.

35. The structure of claim 30, said additional MOS tunneling LED devices over the second surface area of said substrate comprising a PMOS tunneling LED over said substrate, said PMOS tunneling LED comprising:

at least one region of p-type impurity in said substrate;

at least one region of n-type impurity overlying said at least one region of p-type impurity in said substrate;

a second layer of gate oxide having a second thickness over said second surface area of said substrate; and at least one patterned layer of polysilicon over said second layer of gate oxide overlying said surface of gate oxide.

36. The structure of claim 30, said additional MOS tunneling LED devices over the second surface area of said substrate comprising a NMOS tunneling LED over said substrate, said NMOS tunneling LED over said substrate comprising:

at least one region of n-type impurity in said substrate;

at least one region of p-type impurity overlying said at least one region of n-type impurity in said substrate;

a second layer of gate oxide having a second thickness over said second surface area of said substrate; and at least one patterned layer of polysilicon over said second layer of gate oxide overlying said surface of gate oxide.

37. The structure of claim 28, said first thickness being between about 40 and 250 Angstroms.

38. The structure of claim 28, said second thickness being between about 10 and 50 Angstroms.

* * * * *